(12) United States Patent
Hahn et al.

(10) Patent No.: US 9,275,751 B2
(45) Date of Patent: Mar. 1, 2016

(54) NONVOLATILE MEMORY DEVICE AND PROGRAM METHOD

(71) Applicants:Wookghee Hahn, Hwaseong-si (KR); Doohyun Kim, Ansan-si (KR); Changyeon Yu, Yongin-si (KR)

(72) Inventors: Wookghee Hahn, Hwaseong-si (KR); Doohyun Kim, Ansan-si (KR); Changyeon Yu, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/476,123

(22) Filed: Sep. 3, 2014

(65) Prior Publication Data

US 2015/0078093 A1    Mar. 19, 2015

(30) Foreign Application Priority Data

Sep. 13, 2013 (KR) .......................... 10-2013-0110646

(51) Int. Cl.
*G11C 16/34* (2006.01)
*G11C 11/56* (2006.01)
*G11C 16/04* (2006.01)

(52) U.S. Cl.
CPC ........ *G11C 16/3459* (2013.01); *G11C 11/5628* (2013.01); *G11C 16/0483* (2013.01)

(58) Field of Classification Search
CPC ........... G11C 16/3459; G11C 16/0483; G11C 11/5628
USPC ............. 365/185.19, 185.17, 185.03, 185.22, 365/185.24
See application file for complete search history.

(56) References Cited

U.S. PATENT DOCUMENTS

| | | | |
|---|---|---|---|
| 6,888,758 B1 | 5/2005 | Hemink et al. | |
| 7,349,263 B2 * | 3/2008 | Kim | G11C 16/12 365/185.19 |
| 7,940,567 B2 | 5/2011 | Moon et al. | |
| 8,472,245 B2 | 6/2013 | Kim | |
| 8,837,215 B2 * | 9/2014 | Lee | G11C 29/04 365/185.03 |
| 2008/0094910 A1 | 4/2008 | Sim | |
| 2009/0141557 A1 * | 6/2009 | Fujiu | G11C 11/5628 365/185.19 |
| 2009/0213652 A1 | 8/2009 | Park et al. | |
| 2010/0118613 A1 * | 5/2010 | Chun | G11C 16/16 365/185.33 |
| 2010/0202197 A1 * | 8/2010 | Shim | G11C 16/3459 365/185.03 |
| 2010/0232230 A1 | 9/2010 | Ueno | |
| 2010/0259993 A1 | 10/2010 | Kang | |
| 2010/0302864 A1 * | 12/2010 | Kim | G11C 16/3404 365/185.22 |

(Continued)

FOREIGN PATENT DOCUMENTS

JP   2011253608 A   12/2011
KR   100751579 B1   8/2007

(Continued)

*Primary Examiner* — Vu Le
*Assistant Examiner* — Sung Cho
(74) *Attorney, Agent, or Firm* — Volentine & Whitt, PLLC

(57) ABSTRACT

A programming method includes a first program loop applying first and second pulses to a selected word line and thereafter determining a threshold voltage for the selected memory cell in relation to first and second verification voltages. Then, upon determining that the threshold voltage is lower than the first verification voltage, performing the second program loop by applying the first pulse to the selected word line, or upon determining that the threshold voltage is higher than the first verification voltage and lower than the second verification voltage, performing the second program loop by applying the second pulse to the selected word line.

11 Claims, 14 Drawing Sheets

(56) References Cited

U.S. PATENT DOCUMENTS

| | | | | |
|---|---|---|---|---|
| 2011/0051510 A1* | 3/2011 | Honma | ............... | G11C 16/10 365/185.03 |
| 2011/0069556 A1* | 3/2011 | Higashi | ............. | G11C 11/5628 365/185.22 |
| 2011/0157998 A1* | 6/2011 | Yang | ............... | G11C 16/10 365/185.22 |
| 2011/0194353 A1* | 8/2011 | Hwang | ............. | G11C 11/5628 365/185.19 |
| 2011/0292724 A1* | 12/2011 | Kim | ............... | G11C 16/0483 365/185.03 |
| 2012/0081970 A1* | 4/2012 | Park | ............... | G11C 16/3454 365/185.19 |
| 2012/0127791 A1* | 5/2012 | Lee | ............... | G11C 16/3459 365/185.03 |
| 2012/0170373 A1* | 7/2012 | Kim | ............... | G11C 11/5628 365/185.19 |
| 2012/0170374 A1 | 7/2012 | Im et al. | | |
| 2012/0218818 A1* | 8/2012 | Han | ............... | G11C 11/5628 365/185.03 |
| 2012/0269002 A1 | 10/2012 | Yoon et al. | | |
| 2013/0039130 A1* | 2/2013 | Lee | ............... | 365/185.19 |
| 2013/0088924 A1* | 4/2013 | Nawata | ............ | G11C 16/10 365/185.22 |
| 2013/0114345 A1* | 5/2013 | Lee | ............... | G11C 16/0483 365/185.22 |
| 2013/0188426 A1* | 7/2013 | Park | ............... | G11C 16/10 365/185.22 |
| 2013/0235657 A1* | 9/2013 | Honma | ............ | G11C 16/3427 365/185.02 |
| 2014/0063972 A1* | 3/2014 | Maeda | ............ | G11C 16/0483 365/185.22 |
| 2014/0340964 A1* | 11/2014 | Shiino | ............ | G11C 16/26 365/185.03 |
| 2015/0070986 A1* | 3/2015 | Hirai | ............... | G11C 16/3459 365/185.03 |
| 2015/0070987 A1* | 3/2015 | Kim | ............... | G11C 16/12 365/185.03 |

FOREIGN PATENT DOCUMENTS

| | | |
|---|---|---|
| KR | 100771520 B1 | 10/2007 |
| KR | 101012129 B1 | 6/2008 |
| KR | 1020090020081 A | 2/2009 |
| KR | 1020090092099 A | 8/2009 |
| KR | 101150645 B1 | 9/2010 |
| KR | 1020100112389 A | 10/2010 |
| KR | 1020110131648 A | 12/2011 |
| KR | 1020120079326 A | 7/2012 |
| KR | 1020120118764 A1 | 10/2012 |
| KR | 1020130016619 A | 2/2013 |

* cited by examiner

| Cell state (Vth) | Bit line voltage | |
|---|---|---|
| | 1st Pulse | 2nd Pulse |
| Vth < Vvfy_P | 0V(VBL_PGM) | Vdd(VBL_INH) |
| Vvfy_P ≤ Vth < Vvfy_M | Vdd | 0V |
| Vvfy_M ≤ Vth | Vdd | Vdd |

Fig. 7

| 0V | Cell state (Vth) | Bit line voltage | |
|---|---|---|---|
| | | 1st Pulse | 2nd Pulse |
| E0 | – | Vdd | Vdd |
| | – | Vdd | Vdd |
| | – | Vdd | Vdd |
| P1 | Vth < Vvfy1_P | 0V | Vdd |
| | Vvfy1_P ≤ Vth < Vvfy1_M | Vdd | 0V |
| | Vvfy1_M ≤ Vth | Vdd | Vdd |
| P2 | Vth < Vvfy2_P | 0V | Vdd |
| | Vvfy2_P ≤ Vth < Vvfy2_M | Vdd | 0V |
| | Vvfy2_M ≤ Vth | Vdd | Vdd |
| P3 | Vvfy3_P ≤ Vth | 0V | Vdd |
| | Vvfy3_P ≤ Vth < Vvfy3_M | Vdd | 0V |
| | Vvfy3_M ≤ Vth | Vdd | Vdd |

NONVOLATILE MEMORY DEVICE AND PROGRAM METHOD

CROSS-REFERENCE TO RELATED APPLICATIONS

A claim for priority under 35 U.S.C. §119 is made to Korean Patent Application No. 10-2013-0110646 filed Sep. 13, 2013, the subject matter of which is hereby incorporated by reference.

BACKGROUND

The inventive concept relates generally to the programming of data in a semiconductor memory device. More particularly, the inventive concept relates to methods of programming a nonvolatile memory device.

Nonvolatile memory devices and memory systems including nonvolatile memory devices have become staple components in a wide variety of contemporary electronic devices including computers, cellular phones, PDAs, digital cameras, camcorders, voice recorders, MP3 players, handheld PCs, game machines, and televisions.

Nonvolatile memory devices include, as examples, mask read-only memory (MROM), programmable read-only memory (PROM), erasable programmable read-only memory (EPROM), electrically erasable programmable read-only memory (EEPROM), and the like.

With an increase in a need for a large-capacity memory devices, multi-level cell (MLC) or multi-bit memory devices capable of storing multi-bit data per memory cell have become more common. It is essential to manage the threshold voltage distributions for MLC during program and read operations in order to maintain an acceptable level of data reliability.

SUMMARY

In one aspect, the inventive concept provides a program method for a nonvolatile memory device including; detecting threshold voltages of selected memory cells by applying a first verification voltage and a second verification voltage to a word line connected to the selected memory cells, applying a first pulse to a word line connected to a first memory cell among the selected memory cells having a threshold voltage lower than the first verification voltage, and applying a second pulse to a word line connected to a second memory cell among the selected memory cells having a threshold voltage higher than the first verification voltage and lower than the second verification voltage, the second pulse having a lower voltage level than the first pulse, wherein during a first period corresponding to application of the first pulse and a second period corresponding to application of the second pulse, the first and second memory cells are set up with program bit line voltages having a same level.

In another aspect, the inventive concept provides a nonvolatile memory device comprising; a memory cell array including a plurality of memory cells, a row decoder that provides a first program pulse and a second program pulse to a word line connected to selected memory cells among the plurality of memory cells during a program loop, wherein the second program pulse is lower than the first program pulse, a page buffer that provides one of a program-inhibit voltage and a program bit line voltage to bit lines connected to the selected memory cells, and control logic that controls operation of the row decoder and page buffer, such that the program bit line voltage is selectively applied to bit lines connected to the selected memory cells during periods corresponding to the first and second program pulses.

In another aspect, the inventive concept provides a method of programming a selected memory cell in a nonvolatile memory device using a sequence of program loops including a first program loop and a succeeding second program loop, the method comprising; performing the first program loop by applying a first pulse and a second pulse to a selected word line associated with the selected memory cell, wherein the second pulse has a lower voltage level than the first pulse, and thereafter determining a threshold voltage for the selected memory cell in relation to a first verification voltage and a second verification voltage higher than the first verification voltage, upon determining that the threshold voltage is lower than the first verification voltage, performing the second program loop by applying the first pulse to the selected word line, and upon determining that the threshold voltage is higher than the first verification voltage and lower than the second verification voltage, performing the second program loop by applying the second pulse to the selected word line.

BRIEF DESCRIPTION OF THE DRAWINGS

FIG. 7 is a table listing exemplary voltage conditions for the dual-pulse program and 2-step verification operations of FIG. 6;

DETAILED DESCRIPTION

Figure 1:
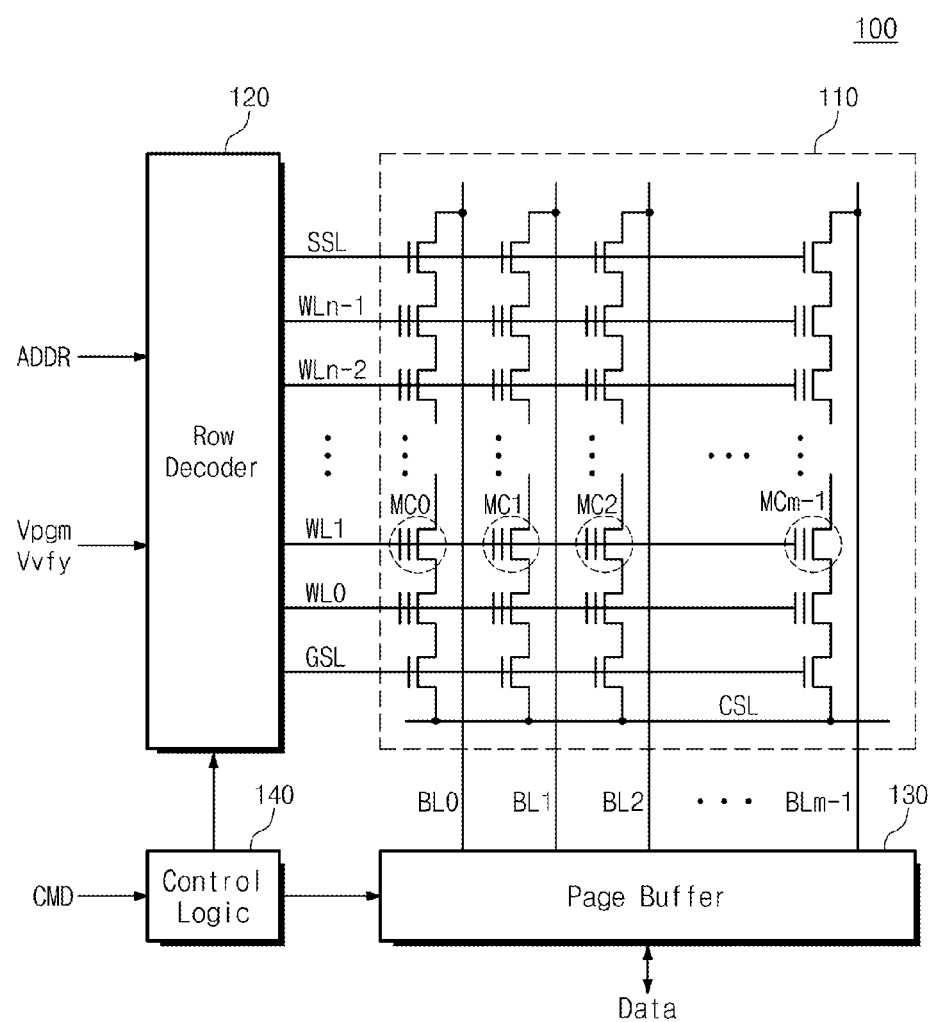
FIG. 1 is a block diagram illustrating a nonvolatile memory device according to an embodiment of the inventive concept.

Certain embodiments of the inventive concept will now be described in some additional detail with reference to the accompanying drawings. The inventive concept, however, may be embodied in many different forms, and should not be construed as being limited to only the illustrated embodiments. Rather, these embodiments are provided as examples so that this disclosure will be thorough and complete, and will fully convey the concept of the inventive concept to those skilled in the art. Unless otherwise noted, like reference numbers and labels denote like or similar elements throughout the drawings and written description.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the written description of embodiments that follows, flash memory device(s) and related method(s) of operation are used to describe a broad range of nonvolatile memory devices, memory systems, and operating methods that fall within the scope of the inventive concept. Those skilled in the art will understand that changes and modifications to the exemplary embodiments may be made without necessarily departing from the scope of the inventive concept.

Figure (FIG. 1 is a block diagram illustrating a nonvolatile memory device according to certain embodiments of the inventive concept. Referring to FIG. 1, a nonvolatile memory device 100 generally comprises in relevant portion; a cell array 110, a row decoder 120, a page buffer 130, and control logic 140. In the context of this exemplary nonvolatile memory device, it is assumed that during a program operation, a 2-step verification operation directed to selected memory cells may be carried out without the use of a particular operating technique (or operation) commonly known as "bit line forcing".

As shown in FIG. 1, the cell array 110 is operatively connected to the row decoder 120 via word lines WL0 to WLn−1 and selection lines SSL and GSL. The cell array 110 is also operatively connected to the page buffer 130 via bit lines BL0 to BLm−1. As will be conventionally understood, the cell array 110 include a plurality of NAND cell transistors, each of which is connected to a bit line through a string selection transistor SST. Memory cells connected to the same word line may be programmed during the same program cycle. For example, each of memory cells MC0 to MCm−1 connected to a word line WL1 may be programmed to the same program state or different program states during the same program cycle. This, assuming the use of 2-bit multi-level memory cells (MLC) in the example of FIG. 1, during any given program cycle, memory cell MC0 may be programmed to a first program state P1, memory cell MC1 may be programmed to a second program state P2, and memory cells MC2 and MCm−1 may be programmed to a third program state P3.

During a program operation, a 2-step verification operation may be used to determine whether the selected memory cells MC0 to MCm−1 have been successfully programmed. That is, when selected memory cells are respectively programmed to a "target state", the resulting threshold voltage(s) may be verified using a pre-verification voltage (Vvfy_P) and a main-verification voltage (Vvfy_M). Hence, memory cells having a threshold voltage lower than the pre-verification voltage may be programmed using a first pulse during a next program loop. In contrast, memory cells having a threshold voltage between the pre-verification voltage and the main-verification voltage may be programmed using a second pulse during the next program loop. Here, the second pulse will have a lower voltage level than the first pulse. An exemplary 2-step verification operation consistent with certain embodiments of the inventive concept will be described hereafter in some additional detail with reference to FIG. 3.

Channels of cell strings of the cell array 110 may be formed in a vertical or horizontal direction. The word lines WL0 to WLn−1 of the cell array 110 may be stacked in a vertical direction, and the cell array 110 may have an all-bit-line (ABL) structure.

The row decoder 120 may be used to select one of memory blocks of the cell array 110 in response to an address (ADDR). The row decoder 120 may be sued to select one of word lines of the selected memory block. The row decoder 120 may provide word line voltages (VWL) from a voltage generator (not shown) to word lines of the selected memory block. For example, during a program operation, the row decoder 120 may transfer a program voltage (Vpgm) to the selected word line and a pass voltage (Vpass) voltage to unselected word lines.

According to certain embodiments of the inventive concept, the program voltage may be provided to a selected word line within a given program loop using at least two program pulses, each having a different voltage level. Thus, a 2-step verification operation for each of the first, second and third program states (P1, P2, and P3) may be performed following application of the program pulses. The row decoder 120 may transfer the pre-verification voltage and the main-verification voltage to a selected word line in order to perform the 2-step verification operation. The row decoder 120 may sequentially provide different levels of program pulses and different levels of verification voltages in order to program memory cells to a target state during each program loop.

The page buffer 130 may operate as a write driver or a sense amplifier according to the type of operation being executed by the nonvolatile memory device 100. During a program operation, the page buffer 130 may be used to transfer a bit line voltage corresponding to "write data" being programmed to a bit line of the cell array 110. During a read operation, the page buffer 130 may be used to sense "read data" stored by selected memory cells via bit lines, and latch the sensed data. Thereafter, the page buffer 130 may be used to output the latched data to an external device.

It is well understood that each program operation may include a number of sequentially executed "program loops". The page buffer 130 may be used to control bit line voltages respectively applied to the memory cell array 110 during these program loops. In general, when a program pulse is applied, the page buffer 130 may control the bit line voltages according to the value of the write data being programmed. For example, assuming a data value of '1' is programmed to single level memory cells (SLC) configured to store 1-bit data, the page buffer 130 provides a bit line with a program-inhibition voltage (VBL_INH). Assuming a data value of '0' is programmed to the SLC, the page buffer 130 provides the bit line with a program bit line voltage (VBL_PGM). In certain embodiments of the inventive concept, the program bit line voltage may be ground voltage or 0V.

It is also possible that during a 2-step verification operation, the page buffer 130 may be used to set up bit lines associated with selected memory cells with a bit line forcing voltage. Using this conventionally understood technique, it is possible to reduce variation in the threshold voltages of the selected memory cells. However, embodiments of the inventive concept need not use bit line forcing techniques and thus, the page buffer 130 need not apply a bit line forcing voltage to bits lines associated with selected memory cells. In contrast, the page buffer 130 may be used to set up bit lines using only the program-inhibition voltage or the program bit line voltage. In other words, the page buffer 130 shown in FIG. 1 need not use bit line forcing during a program loop during which a 2-step verification operation is applied. Using this approach, it is possible to prevent spreading of a threshold voltage distribution caused by application of a bit line forcing voltage (e.g., 1V) to a bit line when a program voltage is applied.

The control logic 140 may be used to control operation of the row decoder 120 and page buffer 130 in response to a received command (CMD) so as to perform program and 2-step verification operations. During the program operation, the control logic 140 may be used to determine whether or not to perform a next program operation according to a result of the 2-step verification operation latched by the page buffer 130. Thus, it is possible to improve a threshold voltage distribution of programmed memory cells and to secure a read margin. An exemplary control method provided by the control logic 140 will be described hereafter in some additional detail.

Although not shown in FIG. 1, those skilled in the art will appreciate that nonvolatile memory device 100 may further comprise a voltage generator capable of providing the program voltage and the pass voltage, wherein the program voltage may be provided as an incremental step programming pulse (ISPP). The voltage generator may also be used to provide the verification voltages (e.g., Vvfy_P and Vvfy_M) described herein.

Figure 2:
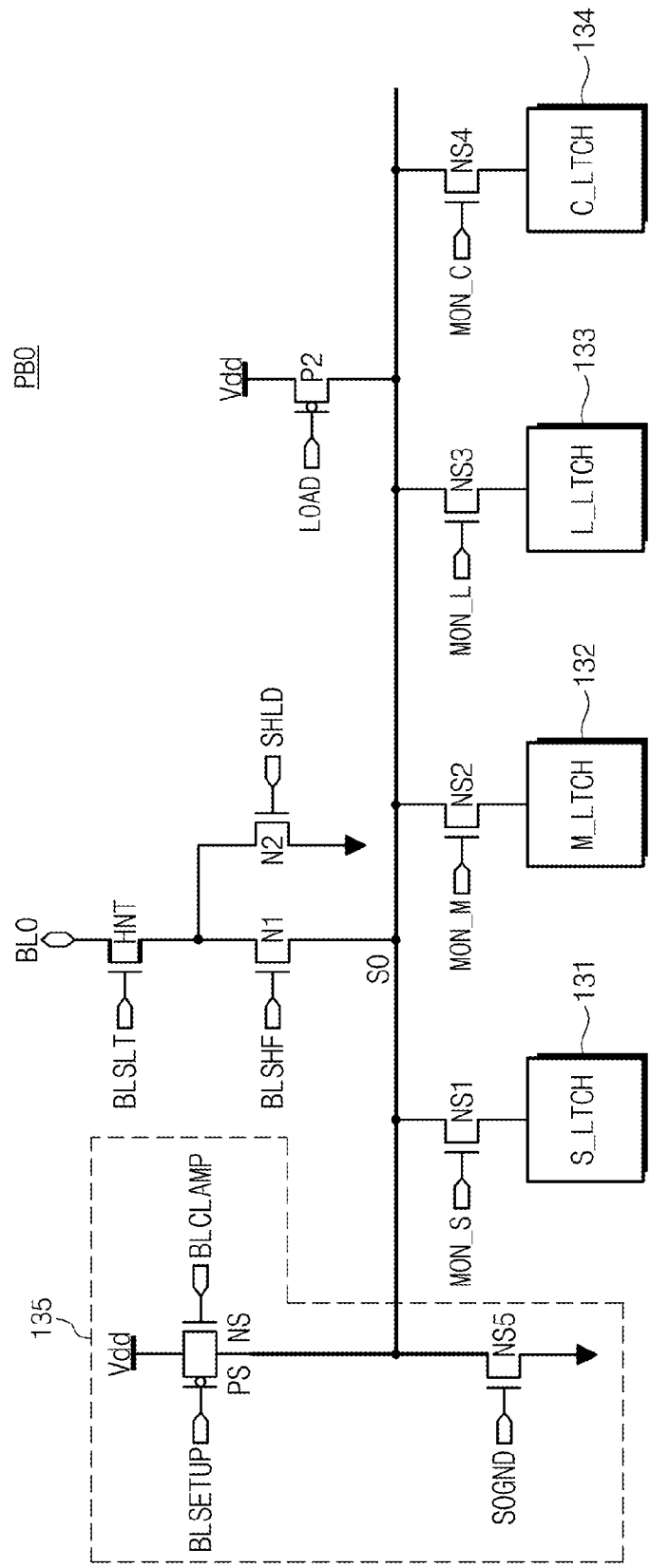
FIG. 2 is a block diagram further illustrating the page buffer of FIG. 1 according to an embodiment of the inventive concept.

FIG. 2 is a block diagram further illustrating in one example a page buffer (PB0) that may be used in the page buffer 130 of FIG. 1 according to an embodiment of the inventive concept. Referring to FIG. 2, the page buffer PB0 is connected to a bit line BL0 in order to provide a bit line voltage during a program operation directed to a memory cell MC0 (FIG. 1). The page buffer PB0 may be used to latch the results of a 2-step verification operation performed in relation to the memory cell MC0. The page buffer PB0 includes a sensing node SO connected to the bit line BL0. The page buffer PB0 further includes a sensing latch 131, data latches 132 and 133, a cache latch 134, and a setup circuit 135. The various latches 131, 132, 133, 134 and 135 are respectively connected to the sensing node SO.

During a program operation, the bit line BL0 may be set up using the setup circuit 135. For example, when control signals (e.g., BLSETUP, BLSLT, and BLSHF) are activated, selection transistors (e.g., HNT, N1, and PS) will be turned ON. Thus, the bit line BL0 will be charged by a power supply voltage (Vdd) provided by the setup circuit 135. The setup level of the bit line BL0 will vary in accordance with the bit data value stored in the data latches 132 and 133. Hence, the bit line BL0 may be charged using this setup operation such that it will retain a particular voltage potential. Those skilled in the art will understand that a number of specific control operations may be sued to "set up" the bit line BL0 in relation to a particular level during a program operation.

By way of comparison it is noted that during application of a bit line forcing voltage in a program operation the page buffer PB0 may charge the bit line BL0 to a particular voltage level using the above-described setup approach. In this context, when the page buffer PB0 sets up the bit line BL0, the remaining page buffers PB1 to PBm−1 of the page buffer 130 may respectively set up corresponding bit lines at the same time. Thus, the page buffer 130 may be susceptible to noise caused by a peak current generated by a setup operation directed to the bit lines. In addition, characteristic operating differences may exist between respective page buffers (PB0 to PBm−1) that are caused by (e.g.,) different driving conditions, process, voltage, and/or temperature differences, etc. As a result, threshold voltage distribution(s) for memory cells may become unacceptably wide during program operations that use bit line forcing.

Thus, in the context of the exemplary page buffer PB0 shown in FIG. 2, the page buffer 130 of FIG. 1 will not be used to perform a bit line forcing operation at a point in time when a program voltage is applied to a selected word line.

Figure 3A:
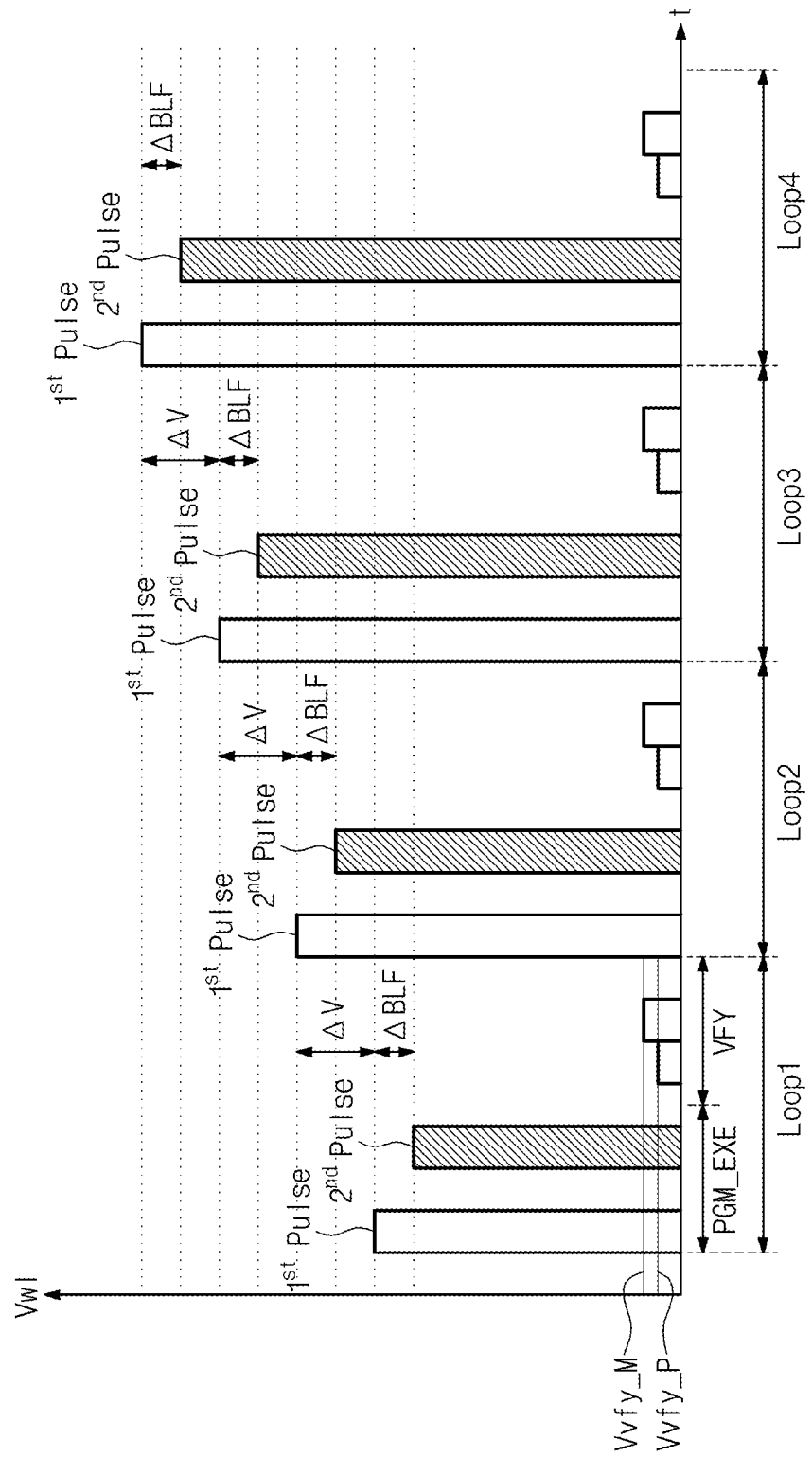
FIGS. 3A, 3B, and 3C are respective waveform diagrams showing voltages supplied to word lines according to various program methods consistent with embodiments of the inventive concept.
Figure 3B:
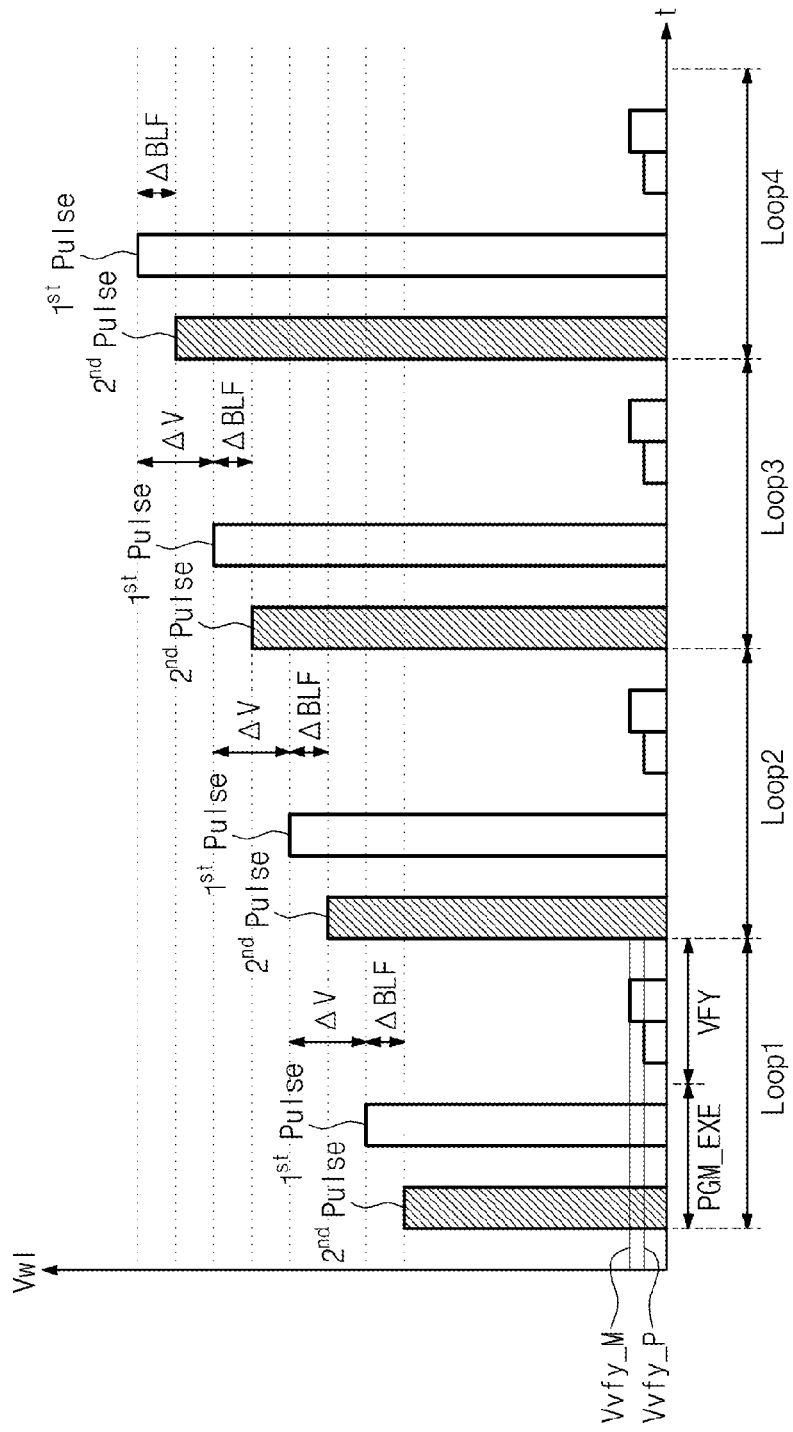
Figure 3C:
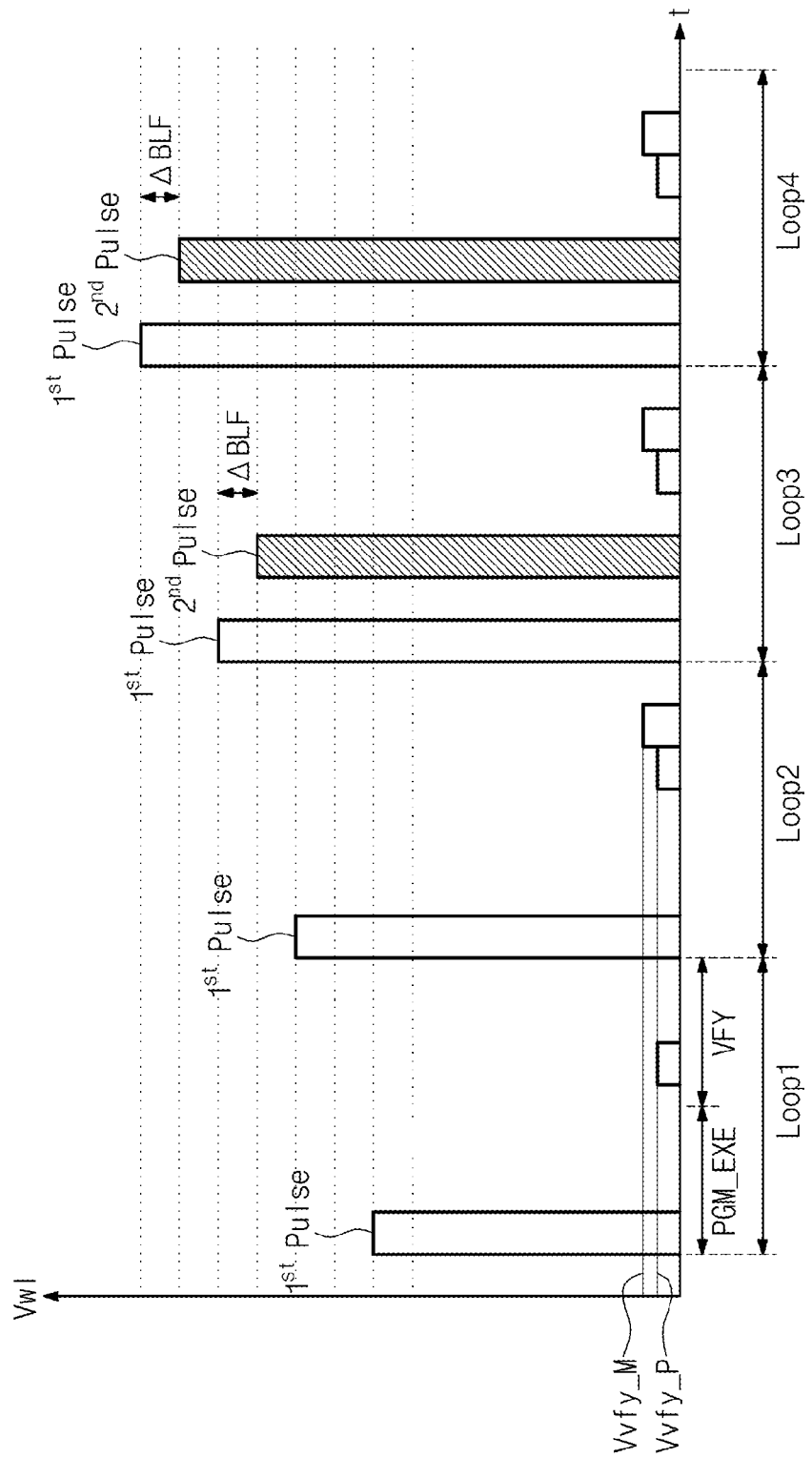

FIGS. 3A, 3B, and 3C are respective waveform diagrams showing word line voltages provided to selected word line(s)

during program methods according to certain embodiments of the inventive concept. In FIGS. 3A, 3B, and 3C the horizontal axis indicate time (t), and the vertical axis indicates voltage level of various word line voltage(s) (Vwl).

FIG. 3A illustrates an example wherein both a dual-pulse program operation and a 2-step verification operation are used. Here, the program operation includes a number of sequentially program loops, each of which includes a program execution period (PGM_EXE) during which dual pulses are applied, and a verification period (VFY) during which the 2-step verification operation is executed. Operations during the program execution period and verification period will be described with reference to a first loop (Loop1).

During the program execution period (PGM_EXE) of the first loop, a first pulse ($1^{st}$ Pulse) and a second pulse ($2^{nd}$ Pulse), collectively, the "dual pulses" are applied to a selected word line. As will be seen, dual-pulse programming may be used to effective execute a 2-step verification operation without bit line forcing. Accordingly, when the first pulse is applied, the bit lines associated with selected memory cells have been set up with the program bit line voltage (VBL_PGM) (e.g., 0V). In contrast, when the second pulse is applied, the bit lines associated with the selected memory cells have been set up with the program-inhibition voltage (VBL_INH) (e.g., Vdd). This bit line control operation may only be applied to the first loop (Loop1).

It is now assumed that all of the selected memory cells have threshold voltages higher than the pre-verification voltage (Vvfy_P). Memory cells having threshold voltages higher than the pre-verification voltage from among the selected memory cells are provided with the program-inhibition voltage during a first pulse period, and the program bit line voltage during a second pulse period.

Embodiments of the inventive concept may be characterized in that the level of a first pulse is different from the level of a second pulse used in a dual-pulse approach. For example, the level of the second pulse may be lower by a defined bit line forcing voltage ($\Delta$BLF) with respect to the first pulse. As a result, bit line forcing voltage levels will not be applied to memory cells having threshold voltages higher than the pre-verification voltage. Instead, the second pulse is provided to a word line associated with the memory cells having threshold voltages higher than the pre-verification voltage. And since the level of the second pulse is lower (e.g., lower by a bit line forcing voltage $\Delta$BLF) than the first pulse, the memory cells having threshold voltage lower than the pre-verification voltage are not subjected to bit line forcing voltage levels. Accordingly, although having the same effect as bit line forcing, the second pulse is provided with greater voltage level particularity.

During the verification period (VFY) of the first loop (Loop1), the pre-verification voltage (Vvfy_P) and main-verification voltage (Vvfy_M) may be applied to the word line associated with the selected memory cells. Memory cells determined to be "fail" memory cells as the result of the verification operation using the pre-verification voltage may be programmed using the first pulse during the second loop (Loop2). On the other hand, memory cells determined to be "pass" memory cells as the result of the verification operation using the pre-verification voltage, and yet also determined to be failed memory cells as the result of the verification operation using the main-verification voltage may be programmed using the second pulse during the second loop. If memory cells are determined to be pass as a result of the verification operation using the main-verification voltage, then they will be program-inhibited during the next loop.

As may be understood from a review of FIG. 3A, the foregoing operations executed during the second and subsequent loops may be essentially the same as those executed during the first loop, except that the voltage levels of the first and second pulses are respectively and successively increased by a defined ISPP increment $\Delta$V.

Consistent with the foregoing description, the nonvolatile memory device 100 of FIG. 1 may perform a 2-step verification operation without the need to use bit line forcing. Instead, a second pulse having a voltage level lower than a first pulse by a defined amount equal to a bit line forcing voltage may be applied to a word line associated with selected memory cells having threshold voltages higher than a pre-verification voltage yet lower than a main-verification voltage. In this manner, it is possible to prevent a target threshold voltage distribution from being further widened by application of a bit line forcing voltage to such memory cells.

FIG. 3B is another waveform diagram illustrating one possible modification to the program method illustrated in FIG. 3A. Here, the lower voltage level, second pulse ($2^{nd}$ Pulse) is applied to a word line associated with selected memory cells before the higher voltage level, first pulse ($1^{st}$ Pulse). In similar vein, the order of application for the pre-verification voltage (Vvfy_P) and main-verification voltage (Vvfy_M) may be reversed. As before, the level of the second pulse is lower by a bit line forcing voltage ($\Delta$BLF) than the first pulse. As a result, bit line forcing will not be applied to memory cells having threshold voltages higher than the pre-verification voltage. Instead, the second pulse is applied to a selected word line connected to selected memory cells having threshold voltages higher than the pre-verification voltage. Since the level of the second pulse is lower by a bit line forcing voltage than the first pulse, the second pulse is provided instead of the bit line forcing with high uncertainty. Although having the same effect as bit line forcing, the second pulse is provided with higher accuracy.

FIG. 3C is yet another waveform illustrating still another modification to the program method illustrated in FIG. 3A. In the example of FIG. 3C, a single pulse program voltage is initially used instead of the dual pulse program voltage previously described during "early program loops" and dual program voltages are used during "later program loops". In certain embodiments of the inventive concept, the single pulse may be the same as the first pulse or the second pulse applied during a later program loop.

Thus, in the example of FIG. 3C, only a first pulse of the dual pulses (first/second pulses) is applied to a selected word line during the program execution period (PGM_EXE) of the first and second program loops. Since threshold voltages of selected memory cells are relatively lower than the pre-verification voltage (Vvfy_P) during early program loops, the selected memory cells may be efficiently programmed using a single pulse, and thereafter verified using only the pre-verification voltage (Vvfy_P). However, once the program loop count reaches a predetermined number (e.g., Loop2) discriminating between early/later program loops, a 2-step verification operation will be used instead of the single step verification operation. That is, memory cells may be programmed during later program loops using the first and second pulses according to certain embodiments of the inventive concept.

Of further note, when selected memory cells are all programmed to have threshold voltages higher than the pre-verification voltage (Vvfy_P), only the second pulse of the dual pulses may be provided.

Figures 4, 5:
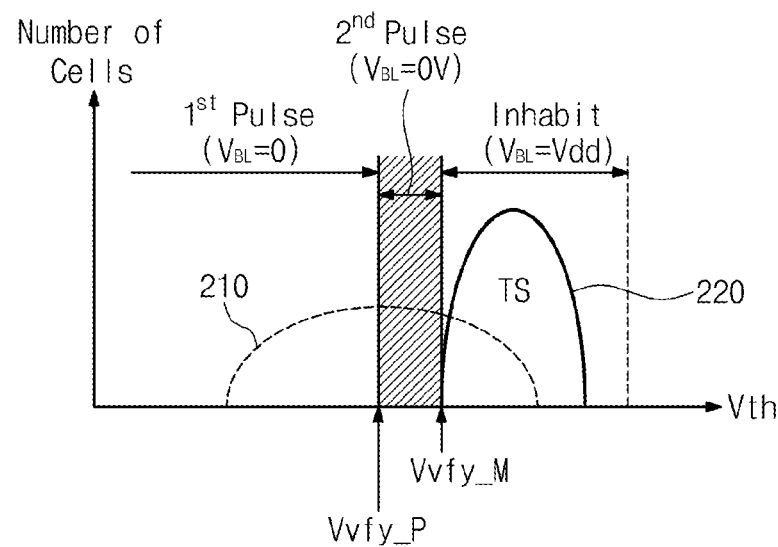
FIG. 4 is a diagram further illustrating the effects of executing a 2-step verification operation according to certain embodiments of the inventive concept.
FIG. 5 is a table listing voltage conditions for a dual-pulse program operation and 2-step verification operation according to embodiments of the inventive concept.

FIG. 4 is a diagram further illustrating a 2-step verification operation according to certain embodiments of the inventive concept. Referring to FIG. 4, memory cells being programmed from an initial state 210 to a target state 220 may be verified using a 2-step verification operation, such as the above-described dual program pulse.

A program voltage is applied to the selected memory cells being programmed to the target state 220. Memory cells being programmed to the target state 220 using a 2-step verification operation executed in relation to a pre-verification voltage (Vvfy_P) and a main-verification voltage (Vvfy_M) will be discriminated in accordance with three threshold voltage level groupings.

First, threshold voltages of selected memory cells may be lower than the pre-verification voltage. Such memory cells will be provided with a first (higher level) pulse as a program voltage. That is, memory cells having threshold voltages lower than the pre-verification voltage will be supplied with a program bit line voltage (VBL_PGM, e.g., 0V) when the first pulse is applied. Bit lines of memory cells having threshold voltages lower than the pre-verification voltage may be set up using the program-inhibit voltage (VBL_INH, e.g., Vdd) when the second pulse is applied.

As a program voltage, the second pulse may be applied to memory cells having threshold voltages higher than the pre-verification voltage and yet lower than the main-verification voltage. Bit lines of memory cells that have threshold voltages higher than the pre-verification voltage and lower than the main-verification voltage may be set up with the program-inhibit voltage when the first pulse is applied. The bit lines of memory cells that have threshold voltages higher than the pre-verification voltage and lower than the main-verification voltage may be set up with the program bit line voltage when the second pulse is applied.

Memory cells that have threshold voltages higher than the main-verification voltage may be program-inhibited during a first pulse period and a second pulse period.

Program methods according to embodiments of the inventive concept, may omit bit line forcing that has been associated with an undesirable spreading of threshold voltage distributions. Such spreading leads to loss of data accuracy. Memory cells may be programmed using a second (relatively lower) pulse enabling a threshold voltage distribution of the target state 220 to be formed more accurately and more precisely, and a 2-step verification operation may be performed.

FIG. 5 is a table listing voltage conditions for a dual-pulse program operation and 2-step verification operation according to an embodiment of the inventive concept. Referring to FIGS. 4 and 5, there are shown bit line voltages according to threshold voltage levels of memory cells being programmed to target states.

When a first pulse is provided to a selected word line, memory cells having threshold voltages lower than a pre-verification voltage may be provided with 0V through corresponding bit lines. Here, 0V may be an exemplary program bit line voltage (VBL_PGM). When a second pulse is provided to a word line, memory cells having threshold voltages lower than a pre-verification voltage may be provided with a program-inhibit voltage (VBL_INH) through corresponding bit lines. Here, an exemplary level of the program-inhibit voltage may be a power supply voltage Vdd. However, levels of the program bit line voltage and the program-inhibit voltage need not be limited to the levels disclosed in the table of FIG. 5.

Memory cells that have threshold voltages higher than the pre-verification voltage and lower than the main-verification voltage may be program-inhibited when the first pulse is applied to a word line. That is, when the first pulse is applied to a word line connected to the memory cells that have threshold voltages higher than the pre-verification voltage and lower than the main-verification voltage, the program-inhibit voltage may be applied to bit lines of such memory cells. For example, the program-inhibit voltage may be a power supply voltage Vdd.

Memory cells that have threshold voltages higher than the pre-verification voltage and lower than the main-verification voltage may be programmed when the second pulse is applied to a selected word line. That is, when the second pulse is applied to the selected word line connected to memory cells having threshold voltages higher than the pre-verification voltage and lower than the main-verification voltage, the program bit line voltage may be applied to bit lines of such memory cells. For example, the program bit line voltage may be a ground voltage or 0V.

Memory cells that have threshold voltages higher than the main-verification voltage may be program-inhibited when the first pulse and second pulse $2^{nd}$ Pulse are applied to the selected word line. That is, memory cells that have threshold voltages higher than the main-verification voltage may be supplied with the program-inhibit voltage when the first pulse or second pulse is applied to a selected word line. For example, the program-inhibit voltage VBL_INH may be a power supply voltage Vdd.

Figure 6:
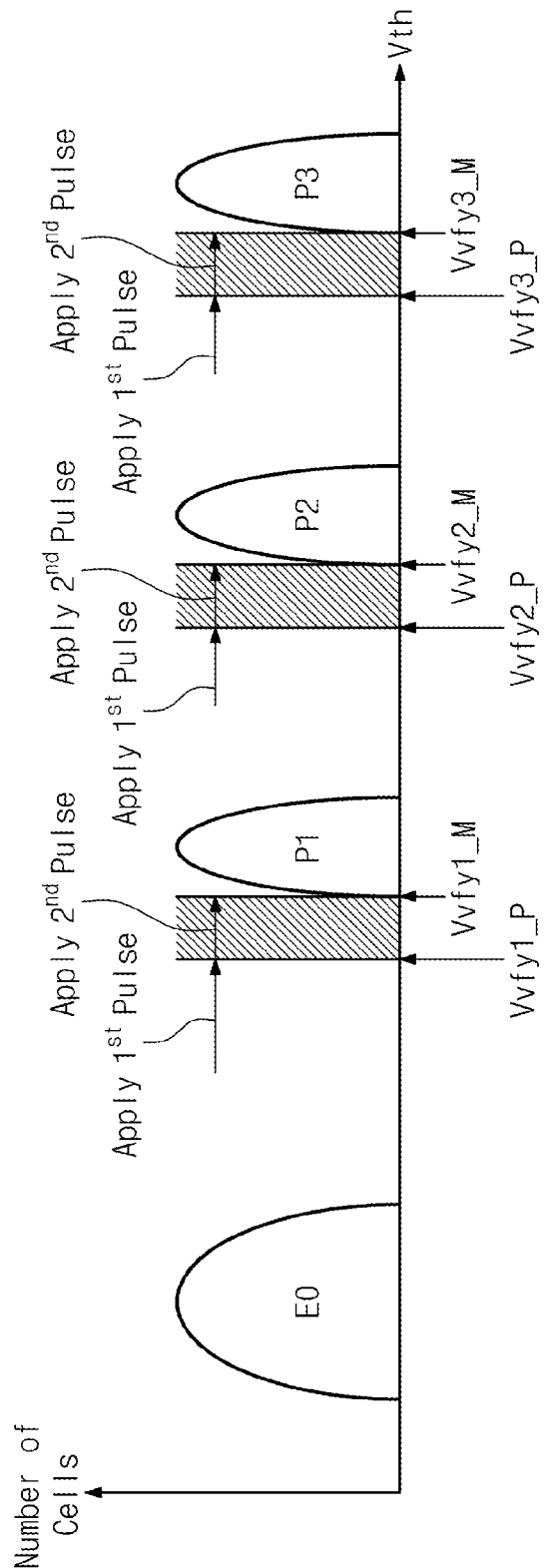
FIG. 6 is a diagram further illustrating dual-pulse program and 2-step verification operations consistent with certain embodiments of the inventive concept.

FIG. 6 is a diagram further illustrating a dual-pulse program operation and 2-step verification operation according to certain embodiments of the inventive concept. The use of 2-bit MLC is assumed for the example of FIG. 6.

Memory cells being programming to a first program state P1 may be verified using a first pre-verification voltage (Vvfy1_P) and a first main-verification voltage (Vvfy1_M). Memory cells having threshold voltages lower than the first pre-verification voltage may be programmed by a first pulse, and may be program inhibited during a second pulse period. Memory cells having threshold voltages between the first pre-verification voltage and the first main-verification voltage may be programmed by a second pulse, and may be program inhibited during a first pulse period. Memory cells, having threshold voltages higher than the first main-verification voltage from among memory cells being programmed may be program inhibited during the first and second pulse periods. Program pulse and bit line bias conditions will be more fully described with reference to FIG. 7.

Memory cells being programming to a second program state P2 may be verified using a second pre-verification voltage (Vvfy2_P) and a second main-verification voltage (Vvfy2_M). Memory cells having threshold voltages lower than the second pre-verification voltage may be programmed by the first pulse, and may be program inhibited during the second pulse period. Memory cells having threshold voltages between the second pre-verification voltage and the second main-verification voltage may be programmed by the second pulse, and may be program inhibited during the first pulse period. Memory cells, having threshold voltages higher than the second main-verification voltage from among memory cells being programmed may be program inhibited during the first and second pulse periods.

Memory cells being programming to a third program state P3 may be verified using a third pre-verification voltage (Vvfy3_P) and a third main-verification voltage (Vvfy3_M). Memory cells having threshold voltages lower than the third pre-verification voltage may be programmed by the first pulse, and may be program inhibited during the second pulse period. Memory cells having threshold voltages between the third pre-verification voltage and the third main-verification voltage may be programmed by the second pulse, and may be program inhibited during the first pulse period. Memory cells, having threshold voltages higher than the third main-verification voltage from among memory cells being programmed may be program inhibited during the first and second pulse periods.

With the above description, a 2-step verification operation may be applied to memory cells being respectively programmed to the first, second and third program states P1, P2, and P3 without bit line forcing. Thus, it is possible to prevent threshold voltage distribution(s) of memory cells from being widened as the result of the bit line forcing. As threshold voltage distributions respectively associated with the first, second and third program states P1, P2, and P3 are improved, read margin and data reliability for the nonvolatile memory device 100 also improve.

There is described an embodiment in which a program method of the inventive concept is applied to a 2-bit MLC. That is, dual-pulse programming and 2-step verifying may be applied to selected MLC being respectively programmed to at least one of the first, second and third program states P1, P2, and P3.

FIG. 7 is a table listing exemplary voltage conditions for the dual-pulse program operation and 2-step verification operation of FIG. 6.

Memory cells having threshold voltages lower than a first pre-verification voltage Vvfy1_P from among memory cells being programmed to the first program state P1 may be programmed by a first pulse during a next program loop. During a first pulse period, a page buffer 130 (refer to FIG. 1) may supply a program bit line voltage VBL_PGM (e.g., 0V) to bit lines of memory cells having threshold voltages lower than the first pre-verification voltage (Vvfy1_P). During the first pulse period, the page buffer 130 may supply a program-inhibit voltage VBL_INH (e.g., Vdd) to bit lines of memory cells having threshold voltages higher than the first pre-verification voltage (Vvfy1_P).

Memory cells having threshold voltages lower than the first pre-verification voltage (Vvfy1_P) may be program inhibited during a second pulse period. During the second pulse period, the page buffer 130 may supply a program-inhibit voltage VBL_INH (e.g., Vdd) to bit lines of memory cells having threshold voltages lower than the first pre-verification voltage (Vvfy1_P). During the second pulse period, the page buffer 130 may supply the program bit line voltage VBL_PGM (e.g., 0V) to bit lines of memory cells having threshold voltages between the first pre-verification voltage (Vvfy1_P) and a first main-verification voltage (Vvfy1_M). During the second pulse period, the page buffer 130 may supply the program-inhibit voltage VBL_INH (e.g., Vdd) to bit lines of memory cells having threshold voltages higher than the first main-verification voltage (Vvfy1_M).

Memory cells having threshold voltages lower than a second pre-verification voltage Vvfy2_P from among memory cells being programmed to the second program state P2 may be programmed by a first pulse during a next program loop. During the first pulse period, the page buffer 130 may supply the program bit line voltage VBL_PGM (e.g., 0V) to bit lines of memory cells having threshold voltages lower than the second pre-verification voltage (Vvfy2_P). During the first pulse period, the page buffer 130 may supply the program-inhibit voltage VBL_INH (e.g., Vdd) to bit lines of memory cells having threshold voltages higher than the second pre-verification voltage (Vvfy2_P).

During the second pulse period, the page buffer 130 may supply the program-inhibit voltage VBL_INH (e.g., Vdd) to bit lines of memory cells having threshold voltages lower than the second pre-verification voltage (Vvfy2_P). During the second pulse period, the page buffer 130 may supply the program bit line voltage VBL_PGM (e.g., 0V) to bit lines of memory cells having threshold voltages between the second pre-verification voltage (Vvfy2_P) and a second main-verification voltage (Vvfy2_M). During the second pulse period, the page buffer 130 may supply the program-inhibit voltage VBL_INH (e.g., Vdd) to bit lines of memory cells having threshold voltages higher than the second main-verification voltage (Vvfy2_M).

Memory cells having threshold voltages lower than a third pre-verification voltage Vvfy3_P from among memory cells being programmed to the third program state P3 may be programmed by a first pulse during a next program loop. During the first pulse period, the page buffer 130 may supply the program bit line voltage VBL_PGM (e.g., 0V) to bit lines of memory cells having threshold voltages lower than the third pre-verification voltage (Vvfy3_P). During the first pulse period, the page buffer 130 may supply the program-inhibit voltage VBL_INH (e.g., Vdd) to bit lines of memory cells having threshold voltages higher than the third pre-verification voltage (Vvfy3_P).

During the second pulse period, the page buffer 130 may supply the program-inhibit voltage VBL_INH (e.g., Vdd) to bit lines of memory cells having threshold voltages lower than the third pre-verification voltage (Vvfy3_P). During the second pulse period, the page buffer 130 may supply the program bit line voltage VBL_PGM (e.g., 0V) to bit lines of memory cells having threshold voltages between the third pre-verification voltage (Vvfy3_P) and a third main-verification voltage (Vvfy3_M). During the second pulse period, the page buffer 130 may supply the program-inhibit voltage VBL_INH (e.g., Vdd) to bit lines of memory cells having threshold voltages higher than the third main-verification voltage (Vvfy3_M).

Figure 8:
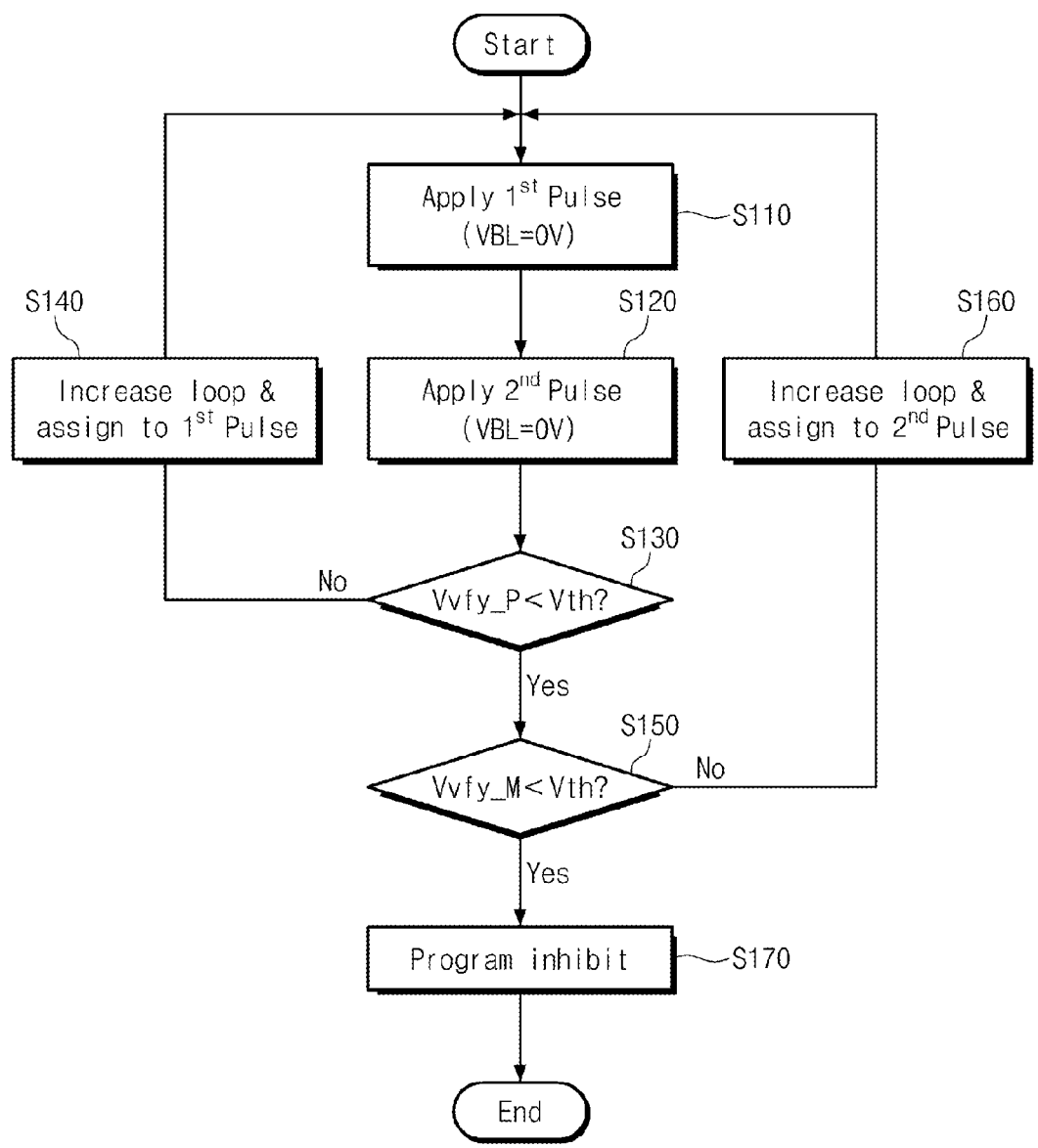
FIG. 8 is a flow chart summarizing in one example a program method according to embodiments of the inventive concept.

FIG. 8 is a flow chart summarizing in one example a program method according to an embodiment of the inventive concept. Referring to FIG. 8, a selected memory cell to be programmed to a "target state" (TS) may be programmed using a 2-step verification operation without bit line forcing.

First, a first pulse ($1^{st}$ Pulse) is applied to a word line associated with the selected memory cell (S110). Hereinafter, it is assumed that a first loop (Loop1) is a loop in which the selected memory cell is first supplied with the first pulse. During a first pulse period, a program bit line voltage (VBL_PGM) (e.g., 0V) is provided to a bit line associated with the selected memory cell.

Then, the selected memory cell is programmed using a second pulse ($2^{nd}$ Pulse) (S120). During a second pulse period, the program bit line voltage provided during the first pulse period may be supplied to the bit line associated with the selected memory cell.

Then, a determination is made as to whether or not the threshold voltage Vth of the selected memory cell is higher than a pre-verification voltage (Vvfy_P) (S130). As a consequence of determining that the threshold voltage Vth of the memory cell is lower than the pre-verification voltage (S130=No), the program loop may be incremented in order to program the selected memory cell having a threshold voltage lower than the pre-verification voltage Vvfy_P using the first pulse $1^{st}$ Pulse (S140). Alternately, as a consequence of determining that a threshold voltage Vth of the memory cell is higher than the pre-verification voltage Vvfy_P (S130=Yes), a further determination is made as to whether the threshold voltage Vth of the selected memory cell is higher than a main-verification voltage Vvfy_M (S150).

In step S140, a program loop may be incremented to program the selected memory cell having a threshold voltage lower than the pre-verification voltage Vvfy_P using the first pulse. With the verification operation using the pre-verification voltage Vvfy_P, the memory cell may be set to be programmed by the first pulse during a next program loop. The method then proceeds to step S110, and the memory cell having a threshold voltage lower than the pre-verification voltage Vvfy_P may be programmed by the first pulse the level of which is increased. The threshold voltage of the memory cell may become higher than the pre-verification voltage Vvfy_P through an iteration of a program loop (e.g., S110→S120→S130→S140). In addition, a second pulse may be applied to the word line associated with the selected memory cell for iteration of the program loop (S110→S120→S130→S140), but a bit line associated with the selected memory cell may be set up with a program-inhibit voltage VBL_INH during a second pulse period.

In step S150, the verification operation determines whether the threshold voltage Vth of the selected memory cell is higher than the main-verification voltage Vvfy_M. As a consequence of determining that a threshold voltage Vth of the memory cell is lower than the main-verification voltage Vvfy_M, the method proceeds to step S160. On the other hand, as a consequence of determining that a threshold voltage Vth of the memory cell is higher than the main-verification voltage Vvfy_M, the method proceeds to step S170.

In step S160, a program loop may be increased to program the memory cell having a threshold voltage higher than the pre-verification voltage Vvfy_P and lower than the main-verification voltage Vvfy_M using a second pulse $2^{nd}$ Pulse. The method proceeds to step S120, and the memory cell having a threshold voltage lower than the main-verification voltage Vvfy_M may be programmed by the second pulse $2^{nd}$ Pulse the level of which is increased.

In step S170, the memory cell having a threshold voltage higher than the main-verification voltage Vvfy_M may be program inhibited afterwards. During first and second pulse periods of next program loops, a program-inhibit voltage VBL_INH may be provided to a bit line of the memory cell. If programming of the memory cell is ended, the method of the inventive concept using the 2-step verification manner may be ended.

There is described an embodiment in which the program method of the inventive concept is applied to a memory cell. During a program operation, a 2-step verification operation may be used, but a bit line forcing operation may not be used. As a result, it is possible to remove uncertainty of a target state due to the bit line forcing. Thus, it is expected to implement a nonvolatile memory device 100 with large read margin through the program method of the inventive concept.

Figure 9:
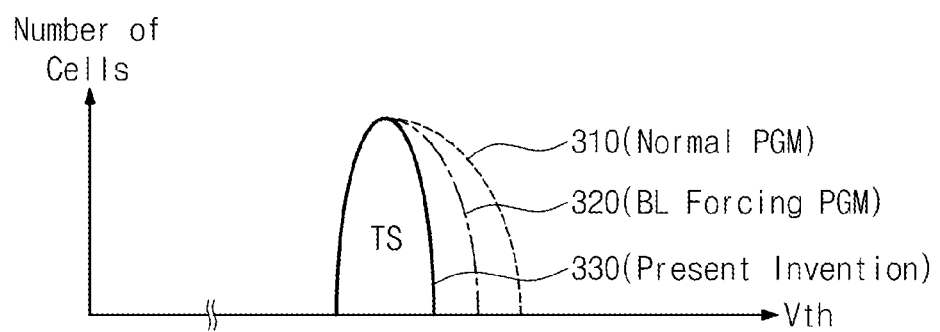
FIG. 9 is a diagram further illustrating the effects of programming a memory cell using a program method consistent with an embodiment of the inventive concept.

FIG. 9 is a diagram further illustrating the effect of using certain program methods consistent with one or more embodiments of the inventive concept. FIG. 9 illustrates a threshold voltage distribution for memory cells when a program operation according to an embodiment of the inventive concept is used.

A first threshold voltage distribution 310 may show a target state TS of memory cells formed by a general program technique. that is, the first threshold voltage distribution 310 may show a target state of memory cells formed at a program operation where a verification voltage is used with respect to a target state TS.

A second threshold voltage distribution 320 may show a target state TS of memory cells formed according to a 2-step verification operation where a bit line forcing manner is used. That is, in the event that a bit line forcing manner is used, bit lines of selected memory cells may be charged with a particular level. An operation of charging bit lines may cause noise, so it is difficult to narrow a threshold voltage distribution of the target state TS due to the noise and other operating conditions.

A third threshold voltage distribution 330 may show a threshold voltage distribution of memory cells formed according to a program method of the inventive concept. With the program method of the inventive concept, a 2-step verification operation may be performed without bit line forcing. Thus, it is possible to incrementally improve a threshold voltage distribution.

Figure 10:
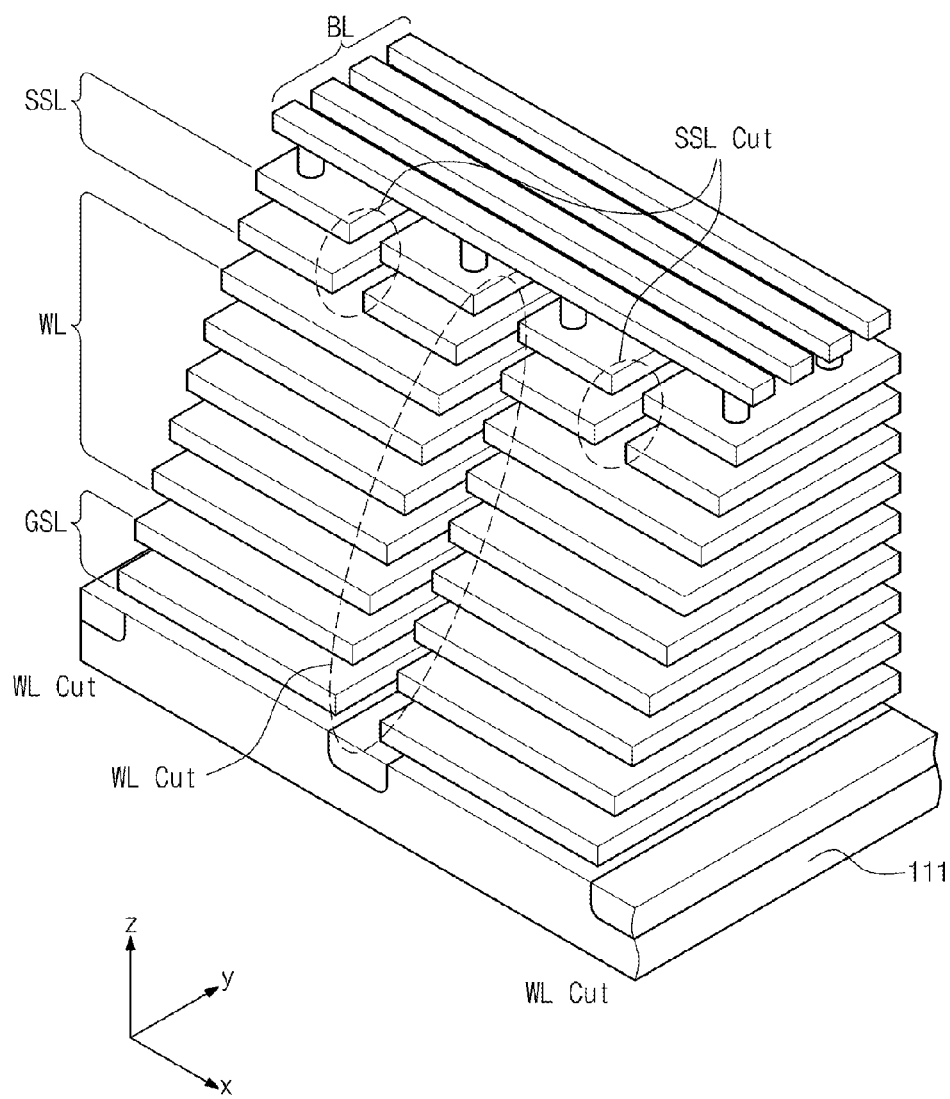
FIG. 10 is a perspective view of a three-dimensional (3D) memory cell array according to certain embodiments of the inventive concept.

FIG. 10 is a perspective view of a cell array according to an embodiment of the inventive concept. Referring to FIG. 10, a cell array 110 may include ground selection lines GSL, a plurality of word lines WL, and string selection lines SSL that are stacked on a substrate 111. The stacked lines (e.g., conductive lines) may be separated by a word line cut WL Cut. Here, at least one string selection line SSL may be separated by a string selection line cut SSL Cut.

A plurality of pillars may be formed to penetrate at least one GSL, the word lines WL, and at least one SSL in a z-direction. Here, the at least one GSL, the word lines WL, and the at least one SSL may be formed by conductive layers, respectively. Also, a plurality of bit lines BL may be formed on upper surfaces of the pillars. The pillars may be connected to corresponding bit lines, respectively.

In FIG. 10, there is illustrated an embodiment in which each of the SSL and GSL is formed of two conductive layers. However, the inventive concept are not limited thereto. For example, each of the SSL and GSL may be formed of a conductive layer or three or more conductive layers.

There is described a three-dimensional stack structure of cell array 110. However, a program method of the inventive concept is applicable to a planar structure of cell array. That is, the program method of the inventive concept may not be limited to a particular array structure.

Figure 11:
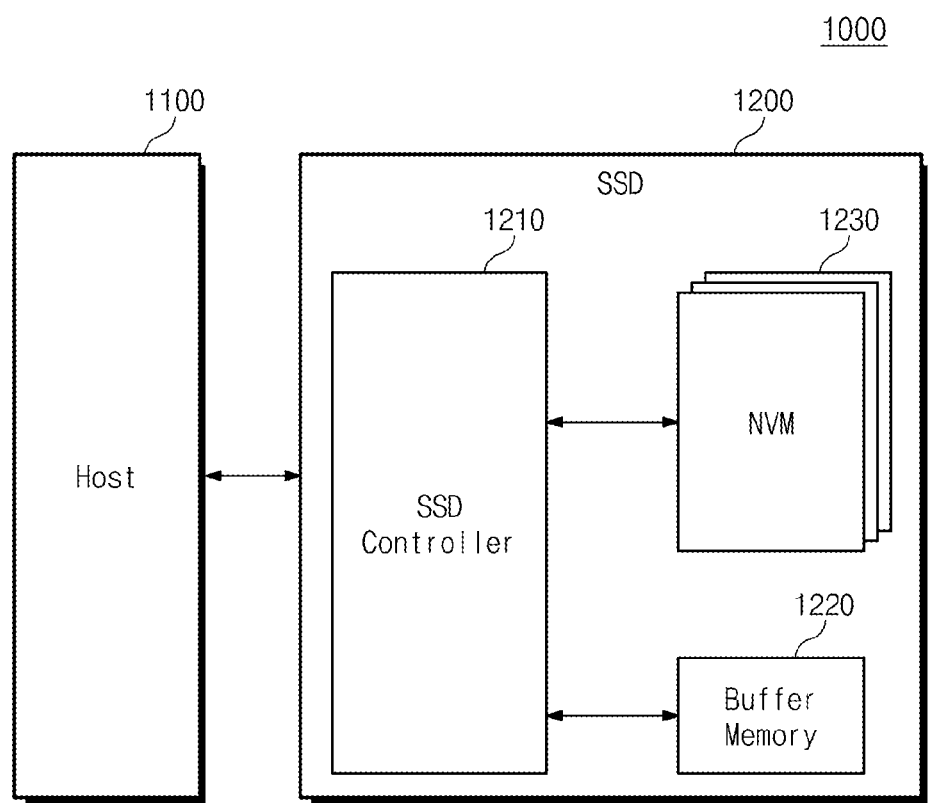
FIG. 11 is a block diagram illustrating a user device including a solid state drive according to an embodiment of the inventive concept.

FIG. 11 is a block diagram illustrating a user device including a solid state drive according to an embodiment of the inventive concept. Referring to FIG. 11, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100 to access the nonvolatile memory device 1230 based on the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1230. In the event that data existing in the nonvolatile memory device 1230 is cached, at a read request of the host 1100, the buffer memory 1220 may support a cache function to provide cached data directly to the host 1100. Typically, a data transfer speed of a bus format (e.g., SATA or SAS) of the host 1100 may be higher than that of a memory channel of the SSD 1200. That is, in the event that an interface speed of the host 1100 is remarkably fast, lowering of the performance due to a speed difference may be minimized by providing the buffer memory 1220 having a large storage capacity.

The buffer memory 1220 may be formed of a synchronous DRAM to provide sufficient buffering to the SSD 1200 used as a mass auxiliary storage device. However, the inventive concept are not limited thereto.

The nonvolatile memory device 1230 may be provided as storage medium of the SSD 1200. For example, the nonvolatile memory device 1230 may be a NAND flash memory device having a mass storage capacity. The nonvolatile memory device 1230 may be formed of a plurality of memory devices. In this case, memory devices may be connected with the SSD controller 1210 by the channel. There is described an embodiment where as a storage medium, the nonvolatile memory device 1230 is formed of a NAND flash memory. However, the nonvolatile memory device 1230 is not limited to a NAND flash memory device. For example, a storage medium of the SSD 1200 may be formed of a PRAM, an MRAM, a ReRAM, a FRAM, a NOR flash memory, and the like. Further, the inventive concept may be applied to a memory system which uses different types of memory devices together.

The nonvolatile memory device 1230 may perform a dual-pulse program operation and a 2-step verification operation. In particular, the use of bit line forcing on memory cells may not be required at a dual-pulse program operation. Thus, it is possible to prevent a threshold voltage distribution of memory cells from being widened due to the bit line forcing. As a result, the nonvolatile memory device 1230 may have high data reliability. The nonvolatile memory device 1230 may be configured substantially the same as that shown in FIG. 1.

Figure 12:
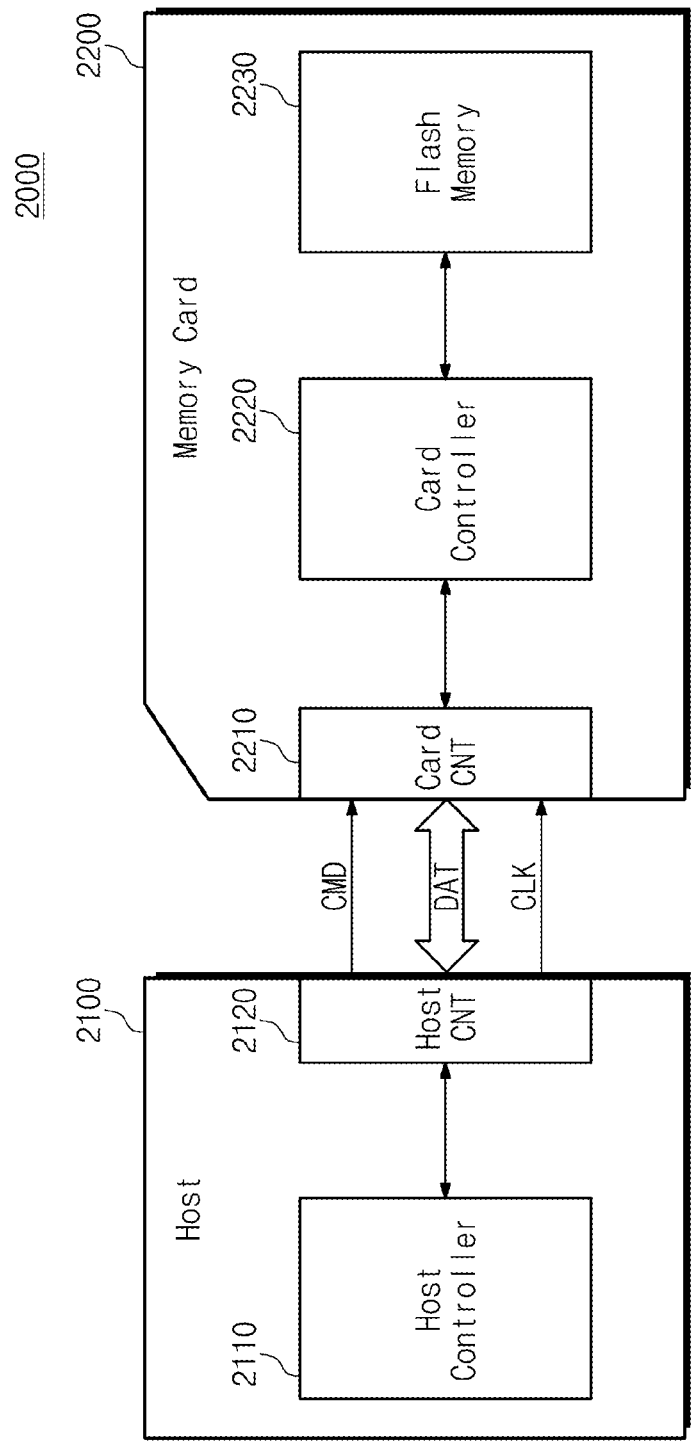
FIG. 12 is a block diagram illustrating a memory card system according to an embodiment of the inventive concept.

FIG. 12 is a block diagram illustrating a memory card system according to an embodiment of the inventive concept. Referring to FIG. 12, a memory card system 2000 may include a host 2100 and a memory card 2200. The host 2100 may include a host controller 2110 and a host connection unit 2120. The memory card 2200 may include a card connection unit 2210, a card controller 2220, and a flash memory 2230.

Each of the host connection unit 2120 and the card connection unit 2210 may be formed of a plurality of pins. Such pins may include a command pin, a data pin, a clock pin, a power pin, etc. The number of pins may vary according to a type of the memory card 2200.

The host 2100 may be configured to write data in the memory card 2200 or to read data stored in the memory card 2200. The host controller 2110 may send a command (e.g., a write command), a clock signal CLK generated within a clock generator (not shown) of the host 2100, and data to the memory card 2200 via the host connection unit 2120.

The card controller 2220 may operate responsive to a write command received via the card connection unit 2210, and may store data in the memory 2230 in synchronization with a clock signal generated by a clock generator (not shown) of the card controller 2220. The memory 2230 may store data transferred from the host 2100. For example, if the host 2100 is a digital camera, the memory 2230 may store image data. The memory card 2200 of the inventive concept may be implemented by an embedded multi-media card (eMMC).

The flash memory 2230 may perform a dual-pulse program operation and a 2-step verification operation. In particular, the use of bit line forcing on memory cells may not be required at a dual-pulse program operation. Thus, it is possible to prevent a threshold voltage distribution of memory cells from being widened due to the bit line forcing. As a result, high data reliability may be provided by the flash memory 2230.

The card connection unit 2210 may be configured to communicate with an external device (e.g., a host) using one of various interface protocols such as USB, MMC, PCI-E, SAS, SATA, PATA, SCSI, ESDI, IDE, and the like.

Figure 13:
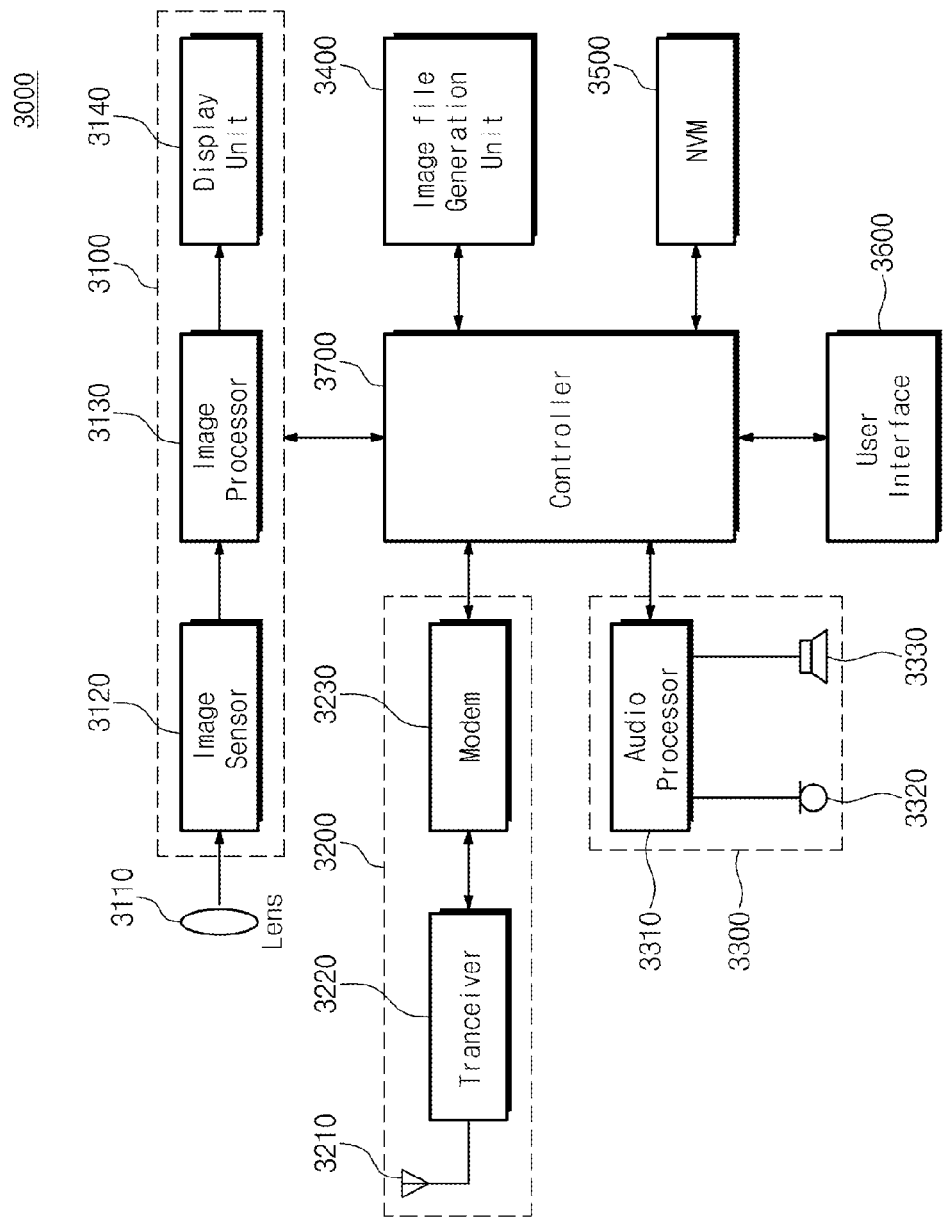
FIG. 13 is a block diagram schematically illustrating a handheld terminal according to an embodiment of the inventive concept.

FIG. 13 is a block diagram schematically illustrating a handheld terminal according to an embodiment of the inventive concept. Referring to FIG. 13, a handheld terminal 3000 according to an embodiment of the inventive concept includes an image processing unit 3100, a wireless transceiver unit 3200, an audio processing unit 3300, an image file generating unit 3400, a nonvolatile memory device 3500, a user interface 3600, and a controller 3700.

The image processing unit 3100 includes a lens 3110, an image sensor 3120, an image processor 3130, and a display unit 3140. The wireless transceiver unit 3200 includes an antenna 3210, a transceiver 3220, and a modem 3230. The audio processing unit 3300 includes an audio processor 3310, a microphone 3320, and a speaker 3330.

Here, the nonvolatile memory device 3500 may be implemented by a memory card (e.g., MMC, eMMC, SD, micro SD, etc.) according to an embodiment of the inventive concept. The nonvolatile memory device 3500 may perform a dual-pulse program operation and a 2-step verification operation. In particular, the use of bit line forcing on memory cells may not be required at a dual-pulse program operation. Thus, it is possible to prevent a threshold voltage distribution of memory cells from being widened due to the bit line forcing. As a result, high data reliability may be provided by the nonvolatile memory device 3500. In addition, the controller 3700 may be implemented by a system on chip configured to drive an application program, an operating system, etc.

A nonvolatile memory device and/or a memory controller according to the inventive concept may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the scope of the following claims.

What is claimed is:

1. A program method for a nonvolatile memory device, the method comprising:
   detecting threshold voltages of selected memory cells by applying a first verification voltage and a second verification voltage to a word line connected to the selected memory cells;
   responsive to the detecting of the threshold voltages of the selected memory cells, applying a first pulse to a word line connected to a first memory cell among the selected memory cells having a threshold voltage lower than the first verification voltage; and
   applying a second pulse to a word line connected to a second memory cell among the selected memory cells having a threshold voltage higher than the first verification voltage and lower than the second verification voltage and applying a program-inhibition voltage to a bit line connected to the second memory cell, the second pulse having a lower voltage level than the first pulse, wherein during a first period corresponding to application of the first pulse and a second period corresponding to application of the second pulse, the first and second memory cells are set up with program bit line voltages having a same level.

2. The method of claim 1, wherein during the applying of the first pulse, the program-inhibition voltage is provided to a bit line connected to a third memory cell among the selected memory cells having a threshold voltage higher than the first verification voltage.

3. The method of claim 1, wherein during the applying of the second pulse, the program-inhibition voltage is provided to a bit line connected to a third memory cell among the selected memory cells having a threshold voltage higher than the first verification voltage.

4. The method of claim 1, wherein during the applying of the first pulse and during the applying of the second pulse, the program-inhibition voltage is provided to a bit line connected to a third memory cell among the selected memory cells having a threshold voltage higher than the second verification voltage.

5. The method of claim 1, wherein a voltage level of the second pulse is lower than a voltage level of the first pulse by an amount equal to a bit line forcing voltage.

6. The method of claim 1, wherein the program bit line voltage is 0V.

7. The program method of claim 1, wherein the detecting of the threshold voltages of selected memory cells by applying the first verification voltage and the second verification voltage to the word line connected to the selected memory cells comprises:
- selecting the first memory cell and the second memory cell; and
- selecting a third memory cell having a threshold voltage higher than the second verification voltage.

8. The method of claim 7, wherein during the applying of the first pulse and during the applying of the second pulse, the program-inhibition voltage is provided to a bit line connected to the third memory cell.

9. A method of programming a selected memory cell in a nonvolatile memory device using a sequence of program loops including a first program loop and a succeeding second program loop, the method comprising:
- performing the first program loop by applying a first pulse and a second pulse to a selected word line associated with the selected memory cell, wherein the second pulse has a lower voltage level than the first pulse, and thereafter determining a threshold voltage for the selected memory cell in relation to a first verification voltage and a second verification voltage higher than the first verification voltage;
- upon determining that the threshold voltage is lower than the first verification voltage, performing the second program loop by applying the first pulse to the selected word line; and
- upon determining that the threshold voltage is higher than the first verification voltage and lower than the second verification voltage, performing the second program loop by applying the second pulse to the selected word line and applying a program bit line voltage to a bit line associated with the selected memory cell.

10. The method of claim 9, wherein a voltage level of the second pulse is lower than a voltage level of the first pulse by an amount equal to a bit line forcing voltage.

11. The method of claim 10, further comprising:
- after determining that the threshold voltage is lower than the first verification voltage and while applying the first pulse to the selected word line, applying the program bit line voltage to the bit line associated with the selected memory cell.

* * * * *